(12) United States Patent
Grille et al.

(10) Patent No.: US 11,506,599 B2
(45) Date of Patent: Nov. 22, 2022

(54) FLUID SENSOR INCLUDING AN OPTICAL FILTER AND A WAVEGUIDE, AND METHOD FOR MANUFACTURING THE FLUID SENSOR

(71) Applicant: Infineon Technologies AG, Neubiberg (DE)

(72) Inventors: Thomas Grille, Villach (AT); Cristina Consani, Villach (AT); Peter Irsigler, Obernberg/Inn (AT); Bernhard Jakoby, Linz (AT); Thomas Krotscheck Ostermann, Koestenberg (AT); Gerald Puehringer, Linz (AT); Christian Ranacher, Gaimberg (AT); Andreas Tortschanoff, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 385 days.

(21) Appl. No.: 16/829,364

(22) Filed: Mar. 25, 2020

(65) Prior Publication Data

US 2020/0309686 A1 Oct. 1, 2020

(30) Foreign Application Priority Data

Mar. 27, 2019 (EP) .................................... 19165539

(51) Int. Cl.
*H01L 31/0232* (2014.01)
*H01L 31/0368* (2006.01)
(Continued)

(52) U.S. Cl.
CPC ...... *G01N 21/3518* (2013.01); *H01L 31/0216* (2013.01); *H01L 31/02327* (2013.01);
(Continued)

(58) Field of Classification Search
CPC ....... G01N 21/3518; G01N 2201/0686; G01N 2201/0833; G01N 21/552; G01N 21/3504;
(Continued)

(56) References Cited

U.S. PATENT DOCUMENTS 7,709,795 B2 * 5/2010 Yamanaka ................ G01J 5/20
250/338.1
10,270,002 B2 * 4/2019 Kautzsch ............. G01N 21/552
(Continued)

FOREIGN PATENT DOCUMENTS

DE 102015111345 A1 1/2016
DE 102015110496 A1 1/2017
(Continued)

*Primary Examiner* — Duy T Nguyen
(74) *Attorney, Agent, or Firm* — Slater Matsil, LLP (57) ABSTRACT

A fluid sensor includes a substrate having a top main surface region, wherein the top main surface region of the substrate forms a common system plane of the fluid sensor, a thermal radiation emitter on the top main surface region of the substrate, an optical filter structure on the top main surface region of the substrate, a waveguide on the main top surface region of the substrate, and a thermal radiation detector on the top main surface region of the substrate, wherein the thermal radiation detector provides a detector output signal based on a radiation strength of the filtered thermal radiation received from the waveguide.

18 Claims, 8 Drawing Sheets

(51) Int. Cl.
    *H01L 31/16*      (2006.01)
    *H01L 31/18*      (2006.01)
    *G01N 21/3518*  (2014.01)
    *H01L 31/0216*  (2014.01)

(52) U.S. Cl.
    CPC ........ *H01L 31/03682* (2013.01); *H01L 31/16* (2013.01); *H01L 31/182* (2013.01); *G01N 2201/0686* (2013.01); *G01N 2201/0833* (2013.01)

(58) Field of Classification Search
    CPC ........... H01L 31/0216; H01L 31/02327; H01L 31/03682; H01L 31/16; H01L 31/182
    USPC ........................................... 257/432
    See application file for complete search history.

(56) References Cited

U.S. PATENT DOCUMENTS

| | | | |
|---|---|---|---|
| 10,345,227 B2 * | 7/2019 | Lavchiev | G01N 21/27 |
| 2007/0101800 A1 * | 5/2007 | Stenberg | G01N 21/031 |
| | | | 250/343 |
| 2013/0081447 A1 * | 4/2013 | Carter | G01N 9/24 |
| | | | 73/30.01 |
| 2014/0061677 A1 * | 3/2014 | Jakoby | G01N 21/648 |
| | | | 257/E33.077 |

FOREIGN PATENT DOCUMENTS

| | | |
|---|---|---|
| FR | 3056750 A1 | 3/2018 |
| WO | 2014032793 A1 | 3/2014 |
| WO | 2017003353 A1 | 1/2017 |

\* cited by examiner

FLUID SENSOR INCLUDING AN OPTICAL FILTER AND A WAVEGUIDE, AND METHOD FOR MANUFACTURING THE FLUID SENSOR

This application claims the benefit of European Patent Application No. 19165539, filed on Mar. 27, 2019, which application is hereby incorporated herein by reference.

TECHNICAL FIELD

Embodiments relate in general to the field of sensor devices and, more specifically, to the field of fluid sensors. In particular, embodiments relate to a fluid sensor, such as a CMOS MID IR gas and liquid sensor based on a formation of a superimposed evanescent field, with an aluminum poly-heater and a thermal radiation detector, such as a pyroelectric AlScN or AlN detector.

BACKGROUND

The detection of environmental parameters in the ambient atmosphere is becoming increasingly important in the implementation of appropriate sensors within mobile devices, for example, but also in the application in home automation, such as smart home, and, for example, in the automotive sector. However, with the evermore extensive use of sensors, there is also a particular need to be able to produce such sensors and inexpensively as possible and, thus, cost effectively. However, the resulting reliability and accuracy of the sensors should nevertheless be maintained or even increased.

In particular, the field of monitoring the air quality and the gas composition in our environment becomes more and more attention. A typical optical gas sensor comprises a light source, filter elements for a wavelength selection, a detector and the sample area where the light between the light source and the detector interacts with the environmental medium. Typically, such sensors are rather bulky.

Generally, there is a need in the art for an approach to implement improved gas sensors having reduced fabrication requirements and providing an adequate sensitivity for the target gas to be detected by the sensor device.

Such a need can be solved by the gas sensor and by the method for manufacturing the gas sensor according to the claims.

Specific implementations of the gas sensor are defined in the dependent claims.

SUMMARY

According to an embodiment, a fluid sensor comprises a substrate having a top main surface region, wherein the top main surface region of the substrate forms a common system plane of the fluid sensor, a thermal radiation emitter on the top main surface region of the substrate, wherein the thermal radiation emitter comprises a semiconductor strip having a main emission surface region for emitting a broadband thermal radiation in a main radiation emission direction parallel to the system plane, an optical filter structure on the top main surface region of the substrate, wherein the optical filter structure comprises a semiconductor material and is configured to filter the broadband thermal radiation emitted by the thermal radiation emitter and to provide a filtered thermal radiation having a center wavelength $\lambda_o$, a waveguide on the main top surface region of the substrate, wherein the waveguide comprises a semiconductor material and is configured to guide the filtered thermal radiation having the center wavelength $\lambda_o$, wherein the guided thermal radiation comprises an evanescent field component for interacting with the surrounding atmosphere comprising a target fluid, and a thermal radiation detector on the top main surface region of the substrate, wherein the thermal radiation detector is configured to provide an detector output signal based on a radiation strength of the filtered thermal radiation received from the waveguide.

According to a further embodiment, a method for manufacturing the inventive fluid sensor comprises: providing a substrate having a dielectric layer which forms the top main surface region of the substrate, and depositing the polysilicon material of the thermal radiation emitter, the optical filter structure, the waveguide and the thermal radiation receiver with a CMOS process on the top main surface region of the substrate.

According to a further aspect, the method may further comprise: sputtering and structuring a metallic layer for at least partially covering the main emission surface region of the highly doped polysilicon semiconductor strip with the metallic layer.

BRIEF DESCRIPTION OF THE DRAWINGS

Embodiments of the present gas sensor are described herein making reference to the appended drawings and figures.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of the same or similar elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, the figures comprise a Cartesian coordinate system x, y, z, wherein the x-y-plane corresponds, i.e. is parallel, to the first main surface region of the substrate (=common system plane), and wherein the direction perpendicular to the first main surface region corresponds to the "z" direction, i.e. is parallel to the z direction. In the following description, the term "lateral" means a direction parallel to the x- or y-direction, wherein the term "vertical" means a direction parallel to the z-direction.

Figure 1A:
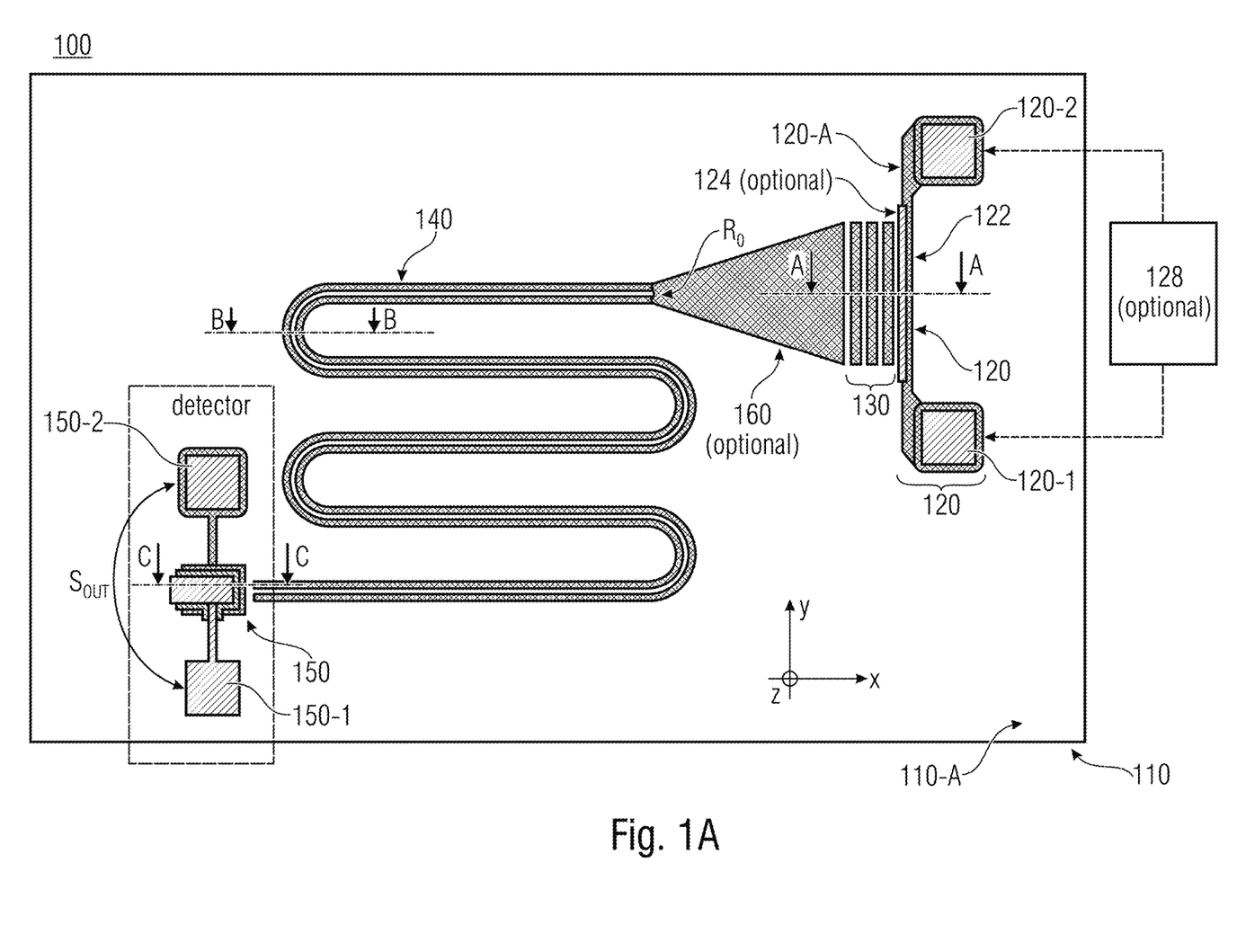
FIG. 1A shows a schematic top view of a gas sensor according to an embodiment.

FIG. 1A shows a schematic top view of a fluid sensor 100 according to an embodiment. The fluid sensor is arranged for sensing an amount or a concentration of a target fluid or a target fluid component in the surrounding atmosphere, e.g. an environmental medium. In the present context, the term fluid may relate to a liquid or a gas. In case, the environmental medium relates to environmental air, the target fluid may relate to a target gas or target gas component which is present in the environmental air. The present concept is equally applicable to sensing a target liquid or a target liquid component in the environmental medium.

The fluid sensor comprises a substrate 110 having a top main surface region 110-A. The top main surface region 110-A of the substrate 110 forms a common system plane of the fluid sensor 100. As shown in FIG. 1A, the fluid sensor further comprises a thermal radiation emitter or IR (IR=infrared) emitter 120 on the top main surface 110-A of the substrate 110. The thermal radiation emitter 120 comprises a semiconductor strip 122 having a main emission surface region 122-C perpendicular to the system plane 110-A for emitting a broadband thermal radiation R, e.g., a broadband IR radiation, at least partially in a main radiation emission direction parallel to the system plane 110-A. At least a part of the emitted thermal radiation is in the IR wavelength range between 0.7 µm and 1 mm, or between 1 µm and 20 µm. Thus, the emitted thermal radiation is infrared (IR) radiation or comprises infrared (IR) radiation.

The fluid sensor 100 further comprises an optical filter structure 130 on the top main surface region 110-A of the substrate 110. The optical filter structure 130 comprises a semiconductor material and is configured to filter the broadband thermal radiation (=broadband IR radiation) emitted by the thermal radiation emitter 120 and to provide a filtered (=narrowband) IR radiation $R_o$ (=filtered thermal radiation) having a center wavelength $\lambda_o$.

The fluid sensor 100 further comprises a waveguide 140 on the main top surface region 110-A of the substrate 110. The waveguide 140 comprises a semiconductor material and is configured to guide the filtered IR radiation having the center wavelength $\lambda_o$ by total reflection. The guided IR radiation comprises an evanescent field component, i.e., a field component outside the waveguide 140, for interacting with the surrounding atmosphere comprising the target fluid, i.e., a target liquid or a target gas.

The fluid sensor 100 further comprises a thermal radiation detector or IR detector (=IR receiver) 150 on the top main surface region 110-A of the substrate 110, wherein the waveguide 140 is optically arranged between the thermal radiation emitter 120 and the thermal radiation detector 150. The thermal radiation detector 150 may comprise at least one of a pyroelectric temperature sensor, a piezoelectric temperature sensor, a pn junction temperature sensor and a resistive temperature sensor. The thermal radiation detector 150 is further configured to provide a detector output signal $S_{OUT}$ based on a radiation strength (=signal strength) of the filtered IR radiation received from the waveguide 140. The thermal radiation detector 150 may provide the detector output signal $S_{OUT}$ between a first and a second detector terminal 150-1, 150-2.

As shown in FIG. 1A, the gas sensor 100 may further optionally comprise an incoupling structure 160 on the top main surface region 110-A of the substrate 110. The incoupling structure 160 comprises a semiconductor material and is configured to couple the filtered narrowband IR radiation $R_o$ having the center wavelength $\lambda_o$ at least partially into the waveguide 140. The incoupling structure 160 has, for example, a tapered shaping between the optical filter structure 130 and the waveguide 140 and extends parallel to the system plane 110-A. The incoupling structure 160 is especially configured to couple a mode of the filtered IR radiation $R_o$ into the waveguide 140, wherein the coupled mode of the filtered IR radiation propagates in the waveguide 140. According to an embodiment, the incoupling structure 160 may be part of the optical filter structure 130 or part of the waveguide 140 or may be part of both.

As shown in FIG. 1A, the thermal radiation emitter 120 comprises the semiconductor strip (=semiconductor wire) 122, wherein a metallic cover layer 124 at least partially or completely covers the main emission surface region 122-C of the semiconductor strip 122. An optional isolation layer (not shown in FIG. 1A) between the metallic layer 124 and the semiconductor wire 122 may be used in order to provide a further homogeneous heating of the device. The optional isolation layer could be air (e.g., a gap) or a layer of an insulating material such as an oxide (e.g., $SiO_2$ or the like). According to an embodiment, the semiconductor strip 122 may comprise a highly doped polysilicon material. The metallic layer 124 may also serve as a reflector for the emitter structure 120. The semiconductor strip 122 may form a black body radiator (=thermal radiation emitter) and may be configured to have in an actuated condition an operating temperature in a range between 600° K and 1000

K or between 600 K and 700 K. According to an embodiment, the thermal radiation emitter 120 is connected via a first and a second terminal 120-1, 120-2 to a power source 128 for providing the thermal radiation emitter 120 with electrical energy to bring the thermal radiation emitter 120 in the actuated condition. Thus, according to an embodiment, a free standing (isolated) highly n-doped polysilicon wire 122 is provided as the thermal radiation emitter 120 that emits broadband IR radiation proportionally to the Planck's radiation law.

As further shown in FIG. 1A, the optical filter structure 130 of the fluid sensor is formed as an optical resonator structure having a narrow transmission band with the center wavelength $\lambda_o$. According to an embodiment, the optical filter structure may comprise at least one of a photonic crystal structure and a Bragg filter structure as wavelength selective optical element(s) for providing the filtered (=narrowband) IR radiation $R_o$ having the center wavelength $\lambda_o$.

For multi-gas sensing, it is also possible to provide several filters/coupling elements 130 at the emitter 120 or at several emitter elements 120 with respectively allocated coupling/filter elements 130/160 and allocated waveguide 140 in order to obtain sensitivity for several fluid, e.g. gases or liquids, to be sensed in the ambient medium, e.g. the ambient atmosphere. Here, the respective waveguide 140 is optimized to the specific wavelength $\lambda_o$ for sensing a specific gas.

Figure 1B:
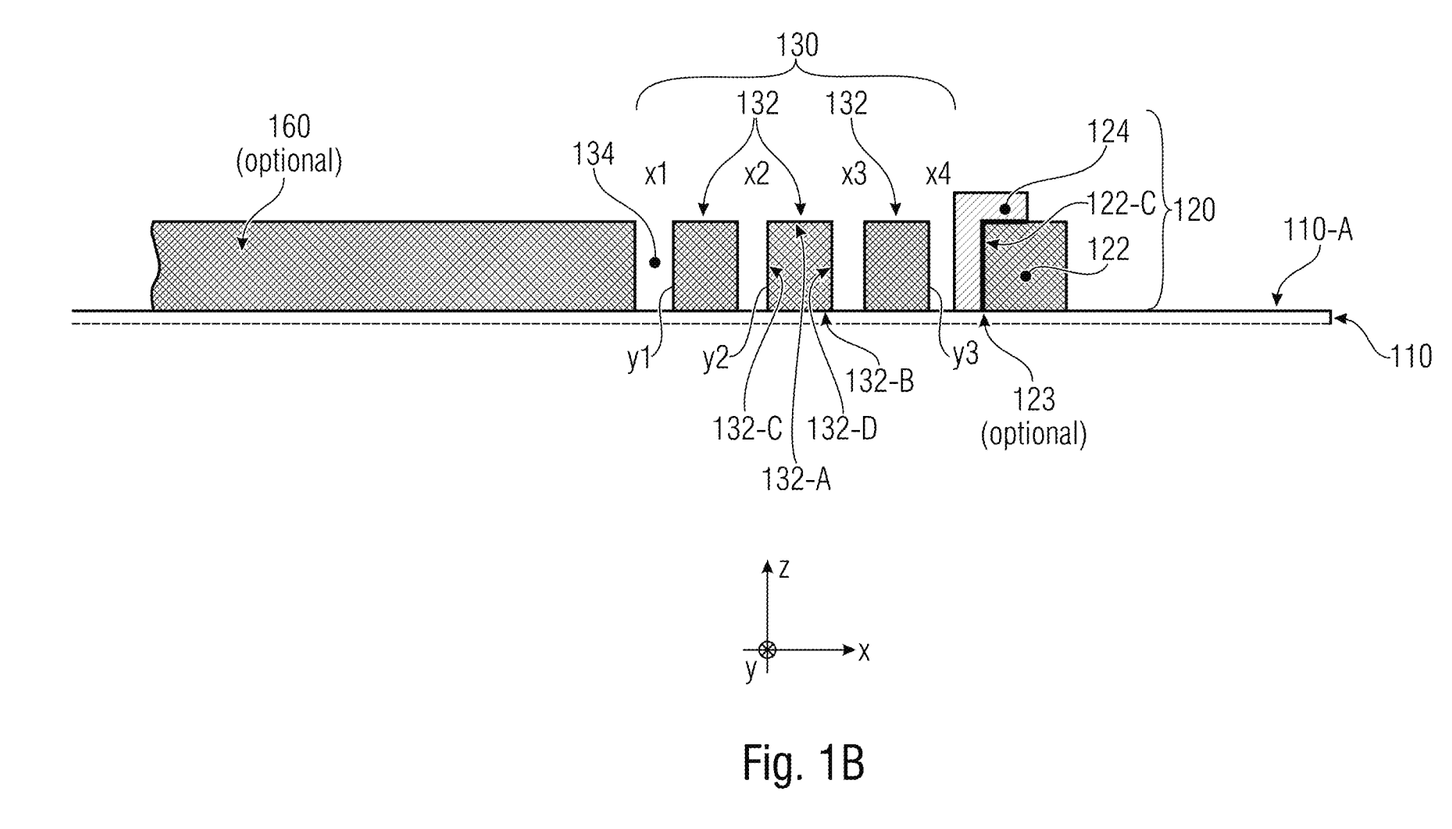
FIG. 1B shows a schematic cross-sectional view of a thermal radiation emitter and the optical filter structure of the gas sensor according to an embodiment.

As shown in the schematic plane view of FIG. 1A and the enlarged schematic cross-sectional view of FIG. 1B along the section line "AA", the optical filter structure 130 may comprise a plurality of laterally spaced semiconductor strips 132 with a gap 134 therebetween. The semiconductor strips 132 are arranged parallel to each other and perpendicular to the IR radiation propagation direction. Each semiconductor strip 132 of the optical filter structure 130 comprise two vertically opposing side faces (=sidewalls) 132-A. 132-B and two laterally opposing side faces (=sidewalls) 132-C, 132-D. The laterally opposing side phases 132-C, 132-D extend vertically to the common system plane 110-A and perpendicular to the IR radiation propagation direction, which corresponds to the main radiation emission direction of the thermal radiation emitter 120. The vertical opposing surface regions (sidewalls) 132-A, 132-B of the semiconductor strips 132 may extend, parallel to the system plane 110-A, for example.

As shown in FIGS. 1A-1B, the (three illustrated) semiconductor strips 132 have a respective lateral thickness y1, y2, y3 and are laterally spaced by the respective distance x1, x2, x3, x4, wherein the distance x1 is between the optical filter structure 130 and the incoupling structure 160 and the distance x4 is between the optical filter structure 130 and the metallic layer 124.

The optical filter structure 130 of the fluid sensor 100 is provided, in order to obtain the filtered thermal radiation $R_o$ having the center wavelength $\lambda_o$ for achieving a maximum interaction or absorption of the filtered thermal radiation $R_o$ with the target fluid. Thus, the optical filter structure 130 adjusts the filtered thermal radiation $R_o$ to match the absorption spectrum of the target fluid (target medium). According to an embodiment, the optical filter structure 130 may comprise a Bragg mirror structure in combination with the thermal radiation emitter 120 in form a semiconductor strip 122 having a metallic cover layer 124, which results in a metallized poly-heater, for example. An optional isolation layer 123 may be provided between the metallic layer 124 and the semiconductor wire 122.

The resulting optical filter structure 130 provides an optical resonator structure for efficiently providing monochromatic or at least narrowband IR radiation (light) of high intensity with a tuned center wavelength $\lambda_o$ between 1 µm and 10 µm, which depends on the dimensioning of the optical resonator structure 130. The optical resonator structure 130 allows the formation of an intensive monochromatic field close to the metal surface of the metallic cover layer 124.

The dimensions of the distances x1, x2, x3, x4 and y1, y2, y3 in FIG. 1B can be approximated by a modified Bragg mirror. To get the precise values for the distances x1, x2, x3, x4 and y1, y2, y3 an optimization algorithm such as genetic algorithm optimization may be used, for example. The optical resonator structure 130 may feature silicon and air as dielectric materials and silver (Ag) as metallic layer 124. The values for the distances x1, x2, x3, x4 and y1, y2, y3 obtained by the optimization process depend on the optical material parameters, the target wavelength $\lambda_o$ and the slab height (in z-direction) of the whole emitter structure 130. As a result the distances x1 to x4 and y1 to y3 may represent an aperiodic or chirped profile as a result of the optimization process. A further consequence of the optimization process may be a value of zero for one of the quantities x1 to x4 and y1 to y3, which would result into a reduction of the number of alternating regions in lateral direction.

Figure 2A:
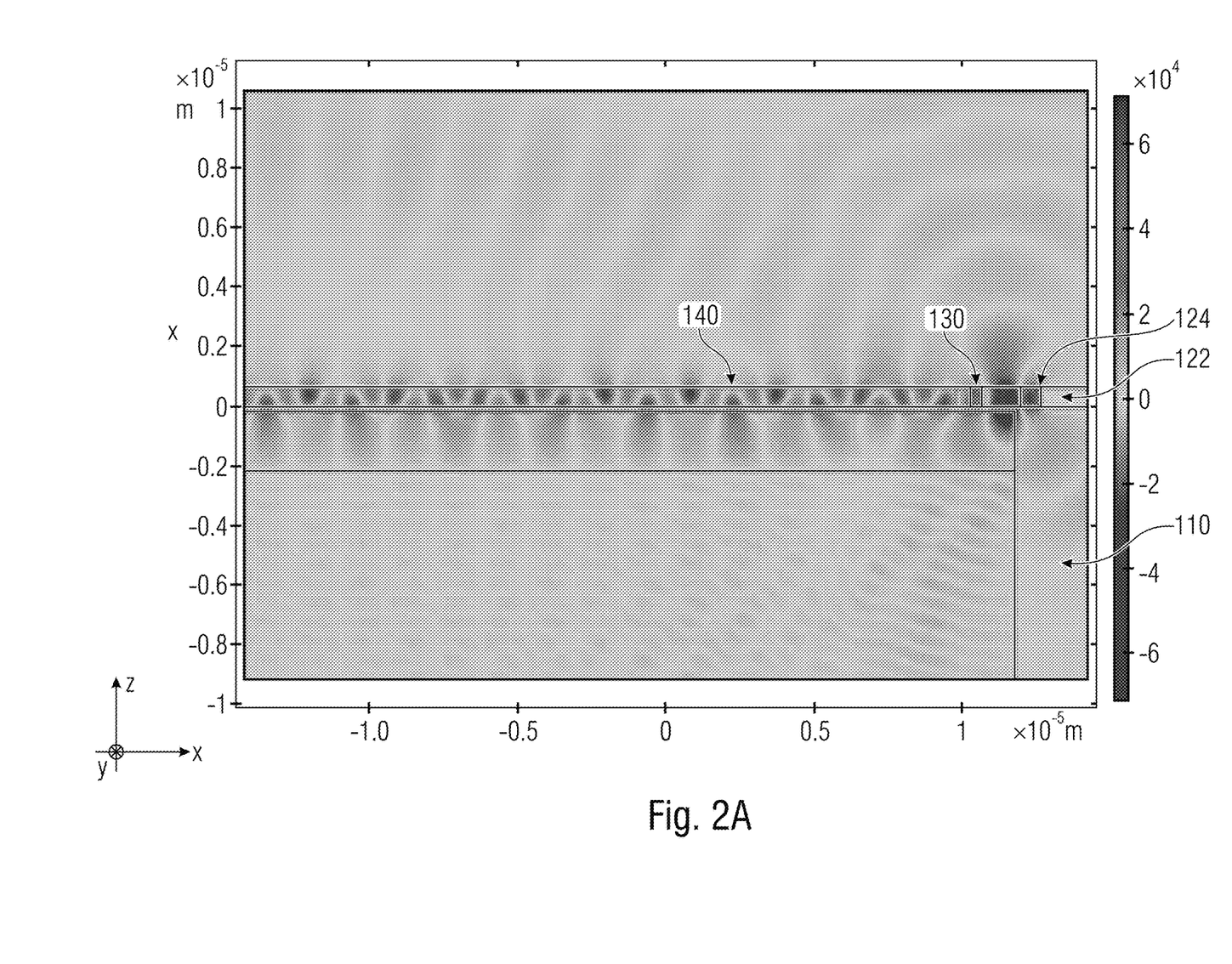
FIG. 2A shows an exemplary schematic cross-sectional view of the thermal radiation emitter, the optical filter structure and the waveguide together with a simulation of the electrical field $E_z$ at the resonance wavelength $\lambda_o$ according to an embodiment.

FIG. 2A shows an exemplary schematic cross-sectional view of the optical resonator structure and the waveguide together with a simulation of the electrical field $E_z$ at the resonance wavelength $\lambda_o$ according to an embodiment. As a consequence of the provision of the metallic cover layer 124 on the main emission surface region 122-C of the semiconductor strip 122 or the corresponding optional isolation layer, the electrical field $E_z$ comprises at the resonance wavelength $\lambda_o$ a field enhancement in the region close to the metallic cover layer 124 by exciting so-called Tamm plasmon-polaritons.

The optimal resonator structure 130 alters the spectral emittance of the metallic layer 124 significantly in order to tailor the emission spectrum for the individual application. In case of sensing applications, the tailoring should result in single-band selective electromagnetic emission at the resonance wavelength $\lambda_o$, which is depending on the dimensions x1-x4 and y1-y3. The electromagnetic cavity mode corresponding to the optical resonator structure 130 directly couples into a slab waveguide structure 140, thus, no additional coupling structure to a slab waveguide 140 is required.

Figure 1C:
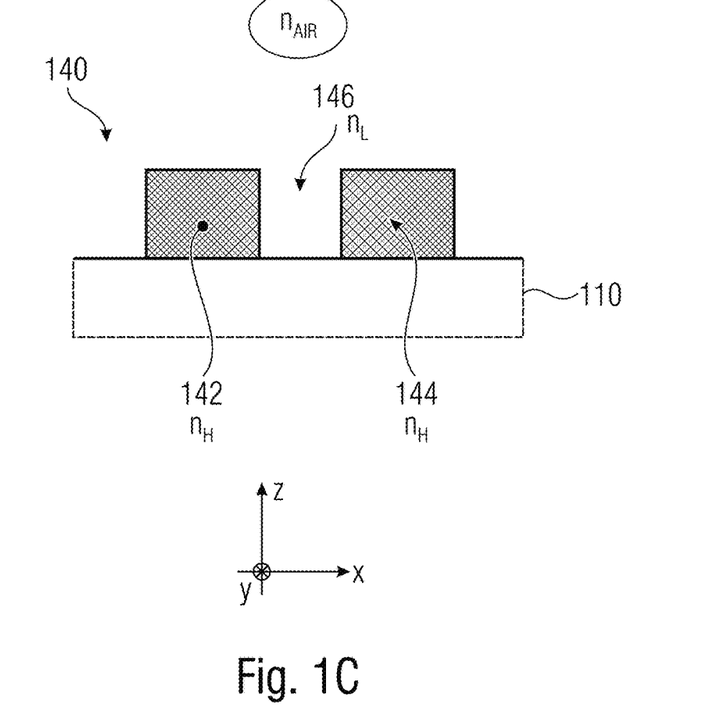
FIG. 1C shows a schematic cross-sectional view of the waveguide of the gas sensor according to an embodiment.

As shown in the schematic plane view of FIG. 1A and the enlarged schematic cross-sectional view of FIG. 1C along the section line "BB", the waveguide 140 may comprise a slot waveguide. The slot waveguide may comprise of at least two (2 to n) strips 142, 144 of high refractive index materials $n_H$ separated by a subwavelength-scale slot region 146 having a low-refractive index $n_L$ and surrounded by the environmental medium, e.g. air, having a low-refractive-index $n_{AIR}$. The slot waveguide is an optical waveguide that guides strongly confined light (=the filtered thermal radiation $R_o$) in the slot region 146.

The waveguide 140 may comprise between the thermal radiation emitter 120 and the thermal radiation detector 150 at least partially a meander-shaped course on the system plane 110-A. According to further embodiments (not shown in FIG. 1A), the waveguide 140 may comprise at least partially between the thermal radiation emitter 120 and the thermal radiation detector 150 a spiral shaped course or a coil shaped course on the system plane 110-A.

According to further embodiments (not shown in FIG. 1A), the waveguide 140 may further comprise a strip waveguide, a slab waveguide or a rib waveguide.

Figure 2B:
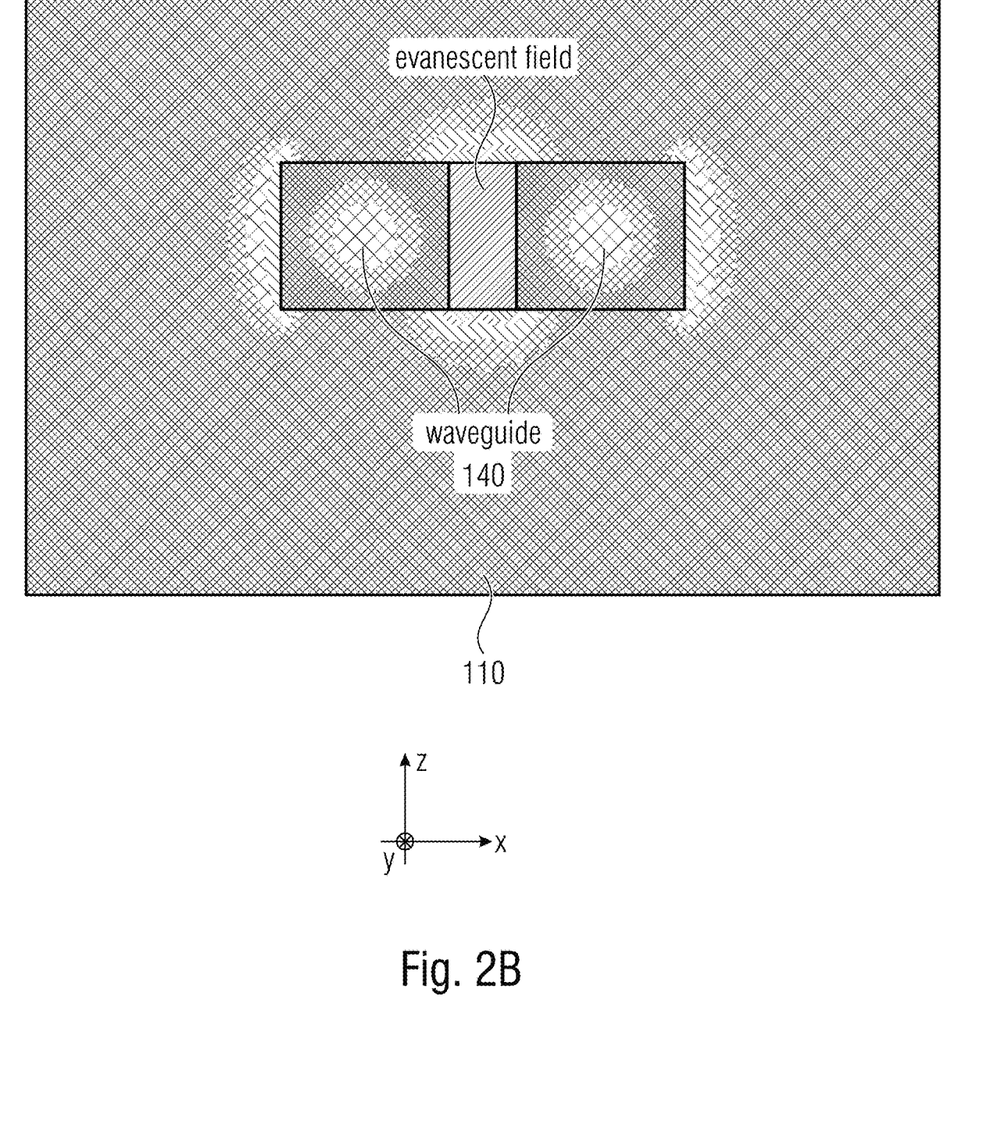
FIG. 2B shows an exemplary schematic cross-sectional view of the slot waveguide together with a simulation of the evanescent field at the resonance wavelength $\lambda_o$ according to an embodiment.

The filtered IR radiation guided by the waveguide 140 comprises an evanescent field component for interacting with the surrounding atmosphere having the target fluid, wherein the interaction of the evanescent field component with the surrounding atmosphere results in a reduction of the transmitted thermal radiation $R_o$ due to absorption of the guided radiation $R_o$ which is a measure for the target fluid concentration in the surrounding atmosphere or medium. FIG. 2B shows an exemplary schematic cross-sectional view of the slot waveguide 140 together with a simulation of the evanescent field at the resonance wavelength $\lambda_o$ according to an embodiment.

In the following, some physical considerations are provided for explaining the term evanescent field or evanescent wave.

In experiments on total reflection, "Goos and Hänchen" determined that the reflected beam does not return at the point of impact but only slightly offset therefrom. With the assumption that the light slightly penetrates the optically thinner medium, this can be illustrated with the help of the geometrical optics, as exemplarily shown in FIG. 3 (=Goos-Hänchen shift).

Figure 3:
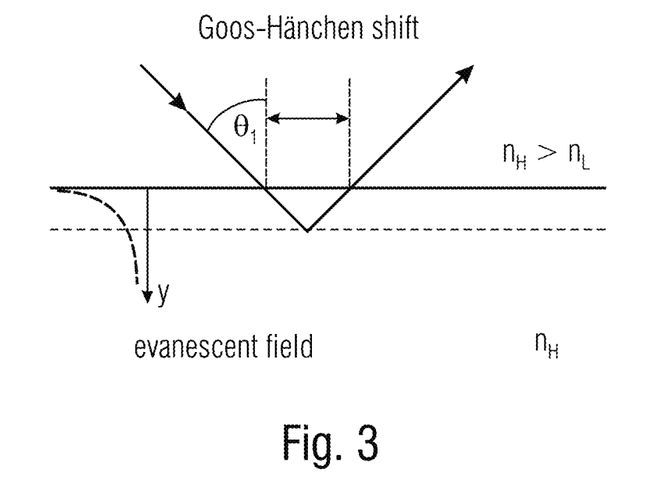
FIG. 3 shows an exemplary schematic cross-sectional view of the waveguide for explaining the evanescent field component of guided radiation in the waveguide.

Obviously, the electromagnetic field of the totally reflected wave does not abruptly drop to zero at the interface. This follows from the continuity conditions for the electromagnetic field during total reflection from the optically denser to the optically thinner medium. Under the condition $\theta<\theta_{CRITICAL}$, a wave propagating along the interface results, which is exponentially attenuated with the penetration depth. This wave in the optically thinner medium is referred to as "evanescent field". The decay factor describes how far the evanescent field penetrates into the optically thinner medium.

This means that the electromagnetic field does not completely disappear in the optically denser medium, only that no energy flows over, i.e. energy passing through the interface flows directly back again. However, if the radiation energy is allowed to interact within the penetration depth, it can be retained, e.g., by absorption, excitation of fluorescence or by another prism or a waveguide in which the light can propagate. This is referred to as attenuated total reflection or frustrated total reflection, respectively.

The characteristics of the evanescent field can be optimized for the respective application by tailored surfaces and waveguide diameters. In the waveguide, the evanescent field decays the faster the smaller the mode number in the waveguide and the greater the refractive index difference between core and environment.

As illustrated in FIG. 1A, a slot waveguide may be used as the waveguide 140, wherein a number n of poly-waveguide strips 142, 144 run in parallel, with n≥2. A slot waveguide may be used because the orientation and the strength of the evanescent field accumulated due to the overlapping fields between the at least two strips 142, 144 of the slot waveguide. Moreover, the course of the slot waveguide may comprise a meander shape or spiral shape for achieving a waveguide path length $L_{140}$ between two and four centimeter, for example, in order to adapt the system to the target application, e.g., in a $CO_2$ range with $CO_2$ as the target gas, to a measurable ratio.

Figure 4:
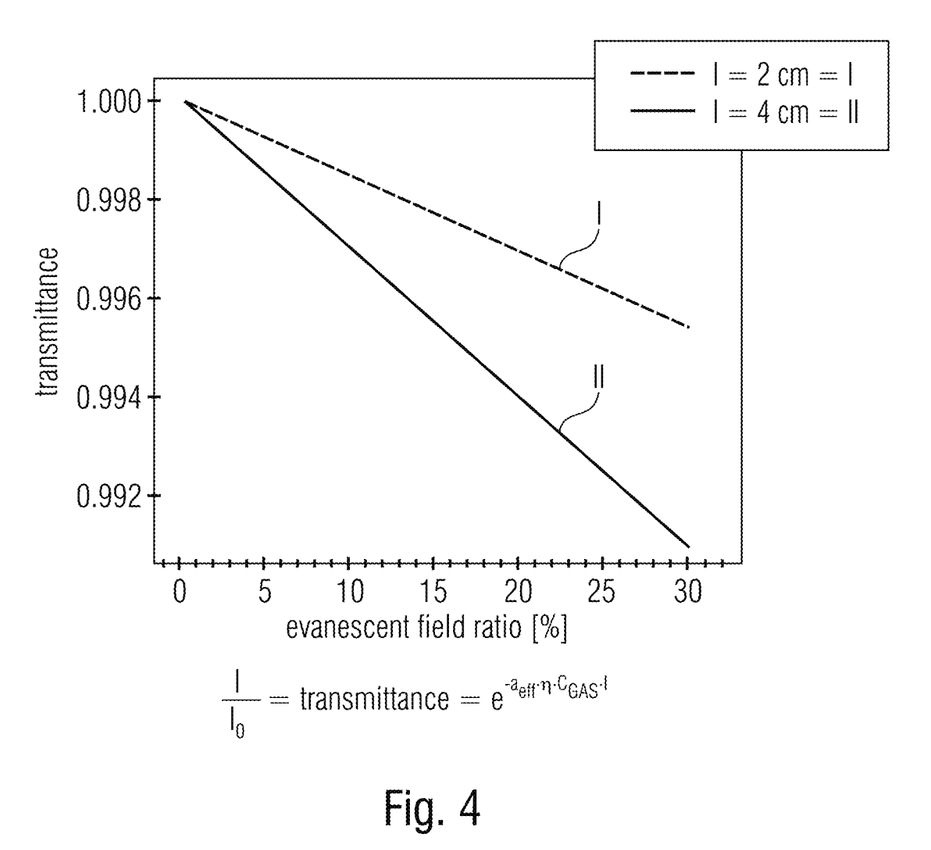
FIG. 4 shows the relationship between the transmittance of the waveguide independence of the evanescent field ratio (EFR) of the waveguide for different lengths of the waveguide.

In this connection, it is referred to FIG. 4 which shows the transmittance in dependence of the EFR (EFR=evanescent field ratio) based on the length of the waveguide path. Assuming a gas concentration $C_{GAS}=100$ ppm (e.g., $CO_2$) and $\alpha_{eff}=74$ 1/cm (for a narrowband IR-source) and a length $L_{140}=2$ cm (I) or 4 cm (II), the transmittance as the ratio of the intensity of the transmitted (I) to incoupled ($I_o$) radiation corresponds to the following formula:

$$\frac{I}{I_0} = \text{Transmittance} = e^{-\alpha_{eff} \cdot \eta \cdot C_{GAS} \cdot L_{140}}$$

As shown in FIG. 4, a slot waveguide having an EFR of about 30% (28.3%) according to simulation can be realized.

Thus, based on a slot waveguide having a length of at least 2 cm or between 2 and 4 cm, for example, the required effective interaction length of the fluid with the radiation $R_o$ guided in the waveguide 140 can be obtained.

To summarize, the fluid sensor 100 may comprise a so-called slot waveguide, wherein in the slot waveguide, an electromagnetic mode propagates in the infrared wavelength range, wherein a significant part of the mode, i.e. the evanescent field, propagates outside the waveguide 140. Due to the specific design of the slot waveguide, a large portion of the mode propagates in the slot 146 between two strips or slabs 142, 144 of the waveguide 140. Thus, an evanescent field proportion of several 10% is possible in slot waveguides.

According to further embodiments, other waveguide 140 types, e.g., a slab waveguide, strip waveguide, etc., may be used even if the proportion of the evanescent field is in a slightly lower percentage range.

By configuring the slot waveguide 140 as a meander, spiral, etc., the effective interaction length $L_{140}$ can be chosen in the range between 2 cm and 4 cm or between 1 cm and 6 cm or even above, for example, wherein simultaneously a very small footprint of the entire fluid sensor 100 in the range of square millimeters (~mm2) can be obtained.

Figure 1D:
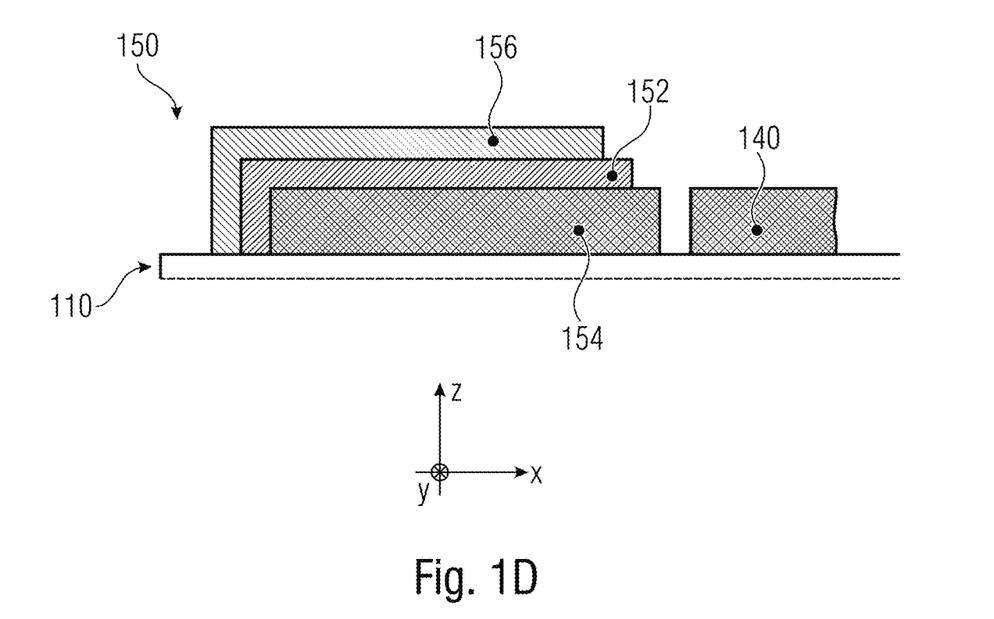
FIG. 1D shows a schematic cross-sectional view of the thermal radiation detector of the gas sensor according to an embodiment.

As shown in the schematic plane view of FIG. 1A and the enlarged schematic cross-sectional view of FIG. 1D along the section line "CC", the thermal radiation detector (=IR receiver) 150 on the top main surface region 110-A of the substrate 110 may comprise a pyroelectric temperature sensor and is configured to provide a detector output signal $S_{OUT}$ based on a radiation strength of the filtered IR radiation received by the thermal radiation detector 150 from the waveguide 140.

A pyroelectric temperature sensor (=passive infrared sensor PIR) 150 may comprises a temperature sensitive layer 152 of a piezoelectric semiconductor crystal on a radiation absorbing layer 154, wherein a temperature change in the radiation absorbing layer 154 and, thus, in the piezoelectric semiconductor crystal 152 leads to a measurable change in the electrical voltage $S_{OUT}$ (=generated electric charge) between a first and a second detector terminal 150-1, 150-2. The output signal $S_{OUT}$ may be converted by a high impedance amplifier, for example, (not shown in FIG. 1A) into an amplified electrical output signal.

Thus, the thermal radiation detector 150 reacts to a change in temperature in the radiation absorbing layer 154 on which the temperature sensitive layer 152 having the pyroelectric material is arranged.

As shown in FIGS. 1A and 1D, a metallic cover layer 156 at least partially or completely covers the temperature sensitive layer 152. The metallic cover layer 156 is electrically connected to or forms the first detector terminal 150-1. The radiation absorbing layer 154 is electrically connected to the second detector terminal 150-2.

To be more specific, the thermal radiation detector 150 is configured to sense the incoming thermal radiation from the waveguide 140 which is a measure of the concentration of the target fluid in the surrounding atmosphere or medium based on the evanescent field absorption affected by the target fluid. Thus, the evanescent field absorption is a measure of the concentration of the target fluid in the surrounding atmosphere.

According to embodiments, the thermal radiation emitter 120, the optical filter structure 130, the optional incoupling structure 160, the waveguide 140 and the thermal radiation detector 150 may comprise a polysilicon material. Thus, the fluid sensor 100 according to FIG. 1A can be manufactured based on inexpensive CMOS processes.

To be more specific, the semiconductor strip 122 of the thermal radiation emitter 120, the laterally spaced semiconductor strips 132 of the optical filter structure 130, the optional incoupling structure 160 and the radiation absorbing layer 154 of the thermal radiation detector 150 may comprise a polysilicon material and may can be manufactured based on inexpensive CMOS processes.

To be more specific, a method for manufacturing the gas sensor 100 may comprise a step of providing a substrate 110 having a dielectric layer 112 which forms the top main surface region 110-A of the substrate 110, and the step of depositing the polysilicon material of the thermal radiation emitter 120, the optical filter structure 130, the waveguide 140 and the thermal radiation detector 150 and, optionally of the incoupling structure 160, with a CMOS process on the top main surface region 110-A of the substrate 110.

The method for manufacturing the gas sensor wo may comprise a step of sputtering and structuring a metallic layer 124 for at least partially covering the main emission surface region 122-C of the highly doped polysilicon semiconductor strip 122 with the metallic layer 124. The optional isolation layer may be provided between the metallic layer 124 and the semiconductor wire 122. The metallic layer 124 may also serve as a reflector for the emitter structure 120.

The method for manufacturing the gas sensor 100 may comprise a further step of sputtering and structuring a metallic layer 156 for at least partially covering the radiation absorbing layer 154 of the thermal radiation detector 150 with the metallic layer 156.

According to an embodiment, the method may be implemented to conduct in this structure a 5-6 layer process, wherein the resulting fluid sensor 100 may have a very small area or footprint. According to an embodiment, an area of 2×2 mm²±0.5 mm² as finished sensor system 100 and an ASIC of approximately the same size may be achieved. Thus, the fluid sensor system provides a planar structure with a very small area.

According to further embodiments (not shown in FIG. 1A), the thermal radiation detector 150 may alternatively comprise a piezoelectric temperature sensor, PN junction temperature sensor or a resistive temperature sensor (not shown in FIG. 1A) and is configured to provide the detector output signal based on a radiation strength of the filtered IR radiation received by the thermal radiation detector 150 from the waveguide 140.

The inexpensive CMOS processes also applicable to the further types of thermal detectors 150, such as the (piezoelectric temperature sensor, the PN junction temperature sensor having a heat characteristic line of a diode and the resistive temperature sensor.

According to a further embodiment (not shown in FIG. 1A), the fluid sensor may comprise a pair of thermal radiation detectors 150 which may be wired as opposite inputs to a differential amplifier, wherein one thermal radiation detector 150 of the pair forms the measurement detector and receives the IR radiation $R_o$ from the waveguide 140 and the other thermal radiation detector 150 forms a reference detector, which is decoupled from the waveguide 140. In such a configuration, the thermal radiation detectors 150 measurements may cancel out the average environmental temperature from the electrical output signal $S_{OUT}$.

Figure 5A:
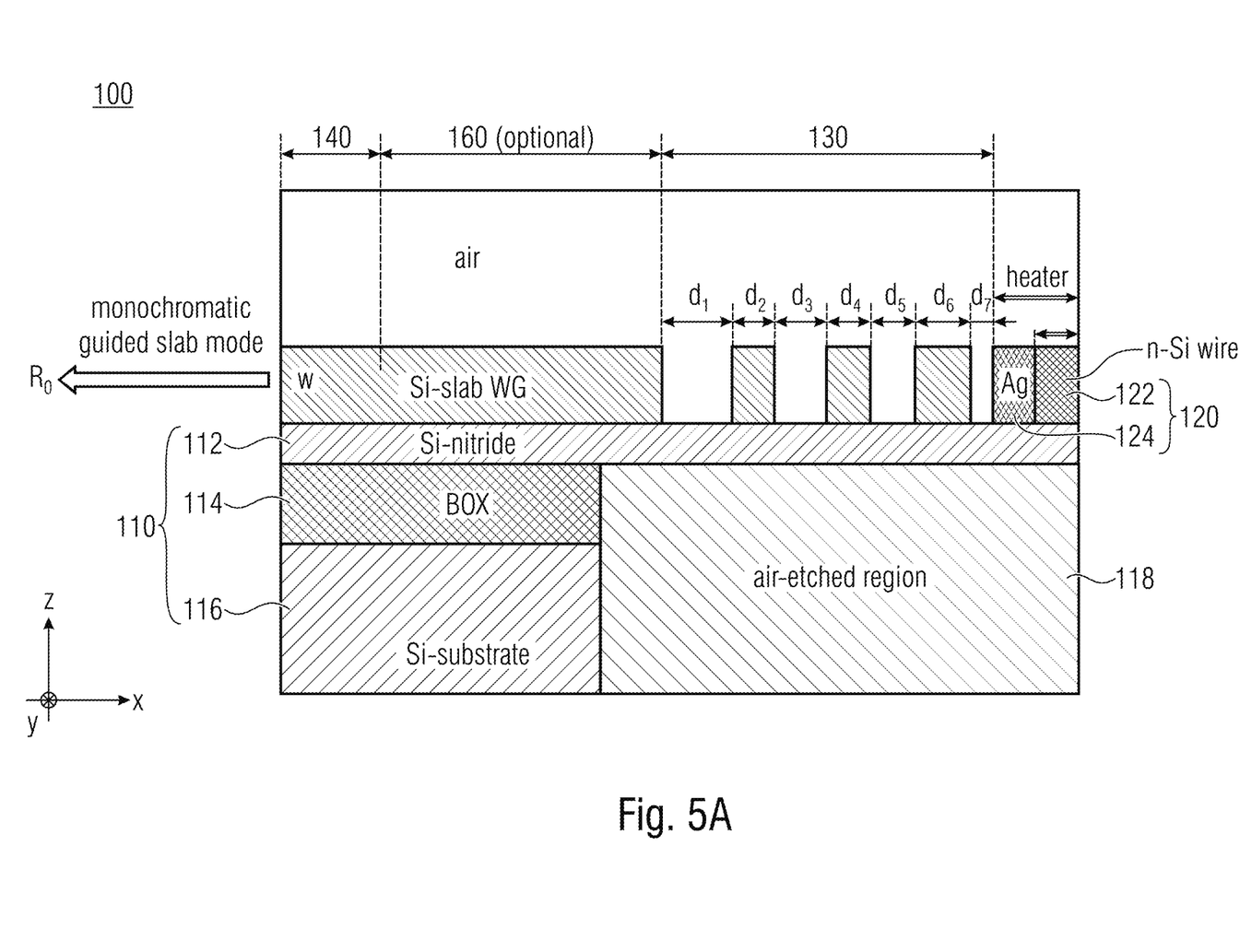
FIG. 5A shows an enlarged schematic cross-sectional view of the IR emitter and the optical filter structure of the gas sensor according to an embodiment.

FIG. 5A shows a detail schematic cross-sectional view of the thermal radiation emitter 120 and the optical filter structure of the fluid sensor 100 according to an embodiment.

As shown in FIG. 5A, the substrate 110 may comprises a plurality of layers e.g., a first insulating (=dielectric) layer 112, a second insulating (=dielectric) layer 114 and a semiconductor substrate layer 116. The first dielectric layer 112 may comprise nitride material, e.g. SiN, the second dielectric layer 114 may comprise an oxide material, e.g. BOX=buried oxide, such as SiO, and the semiconductor substrate layer 116 may comprise silicon. Thus, the first main surface region of the first dielectric layer 112 forms the top main surface region 110-A of the substrate 110. The fluid sensor comprises the thermal radiation emitter 120 on the top main surface region 110-A of the substrate 110, the optical filter structure 130, e.g., in form of a Bragg filter, and the waveguide 140, wherein the optional incoupling structure 160 may be part of the waveguide 140. The thermal radiation emitter comprises the semiconductor strip 122, wherein the metallic cover layer 124 at least partially covers the main emission surface region 122-C of the semiconductor strip 122.

The optical filter structure 130 comprises a plurality of laterally spaced semiconductor strips 132 with a gap 134 therebetween. The semiconductor strips 132 have a respective lateral thickness $d_2$, $d_4$, $d_5$ and are laterally spaced by the respective distance $d_1$, $d_3$, $d_5$, $d_7$, wherein the distance $d_1$ is between the optical filter structure 130 and the incoupling structure 160 and the distance $d_7$ is between the optical filter structure 130 and the semiconductor strip 122.

As shown in FIG. 5A, the substrate structure 110 comprises a cavity 118 vertically below the thermal radiation emitter 120 and (optionally) below the optical filter structure 130. According to embodiments, the substrate 110 may also comprise a further cavity vertically below the thermal radiation detector (not shown in FIG. 5A).

The formation of the cavity in the substrate structure 110 below the thermal radiation emitter 120 and optionally below the thermal radiation detector 150 reduces the heat transfer from the thermal radiation emitter 120 and/or the thermal radiation detector 150 into the adjacent material so that the emission efficiency of the thermal radiation emitter as well as the detection efficiency of the thermal radiation detector can be increased.

Some typical process steps of a CMOS process flow for providing the sensor structure of FIG. 5A may comprise: -providing a semiconductor substrate (=wafer) 116, -forming the second insulating (=dielectric) layer 114, which may comprise an oxide material, e.g. BOX=buried oxide, such as $SiO_2$, on the semiconductor substrate 116, e.g. the whole semiconductor substrate 116. The second insulating layer 114 may comprise a thickness between 500 to 5000 nm, between 1500 and 2500 nm, or about 2000 nm-forming the first insulating (=dielectric) layer 112, which may comprise a nitride material, e.g. SiN, on the second insulating layer 114. The first insulating layer 112 may comprise a thickness between 50 to 500 nm, between 100 and 200 nm, or about 140 nm-forming semiconductor layer, which may comprise a Poly-Si material on the first insulating layer 112. The semiconductor layer may comprise a thickness between 50 to 500 nm, between 100 and 220 nm, or about 160 nm. This semiconductor layer is provided with the same height to form and define at least partially the thermal emitter 120, the optical filter structure 130, the waveguide 140 and the thermal detector 150. -doping the thermal heater (Poly heater) 120 with a dopant, e.g. phosphor, for providing the heating property, and doping the thermal detector 150 with a dopant, e.g. phosphor, for providing the thermal detector 150 with an absorbing property for the thermal radiation (IR radiation).

With respect to the briefly discussed CMOS process flow, it is pointed out to the fact that this process flow is one example of multiple ways of how to fabricate the sensor structure of FIG. 5A, wherein some of the processing steps can be executed in a different order or combined with additional fabrication steps and/or structuring techniques, for example.

Figure 5B:
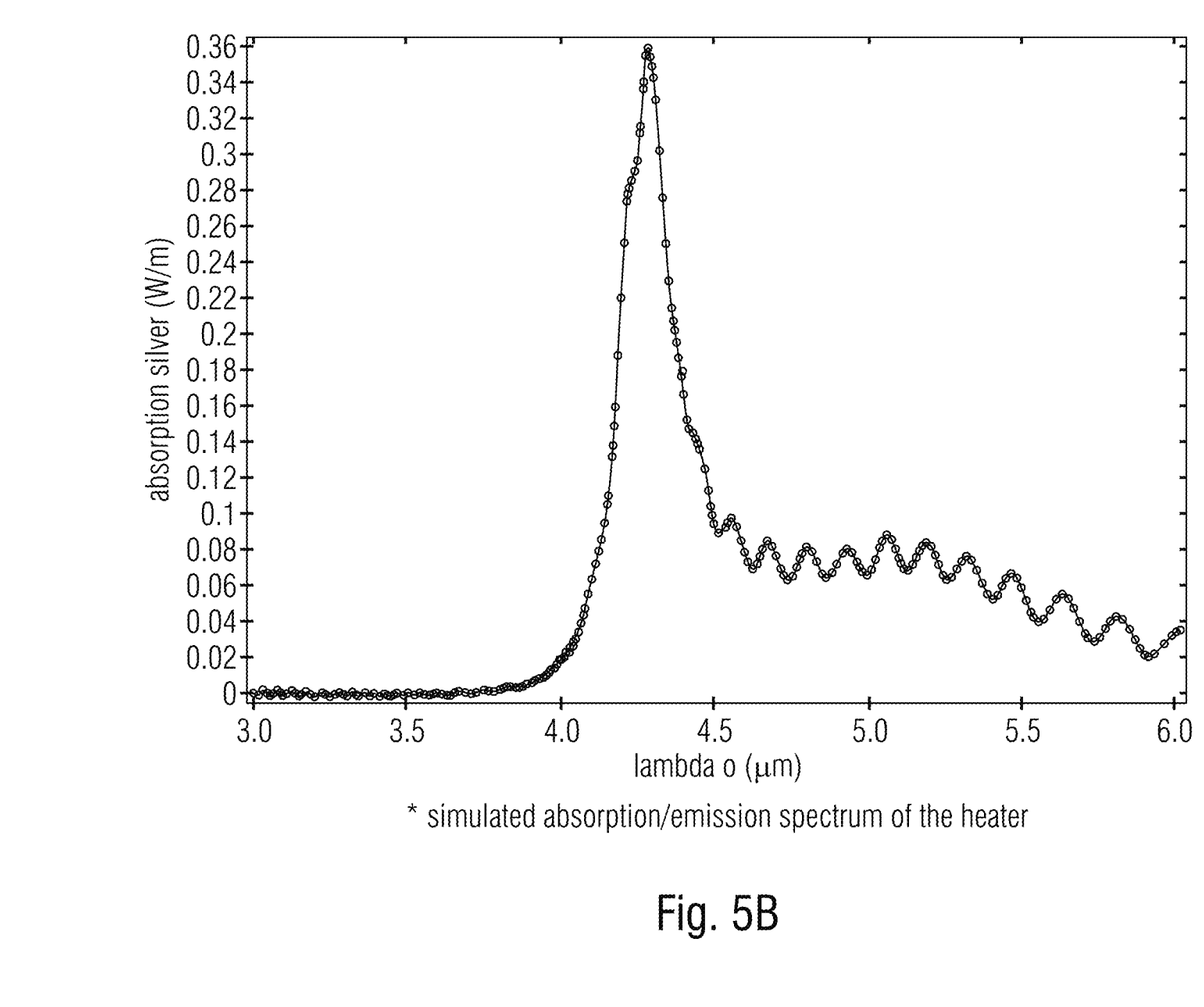
FIG. 5B shows a simulated emission spectrum of the filtered IR radiation emitted by the IR emitter and filtered by the optical filter structure according to embodiment.

FIG. 5B shows a simulated absorption/emission spectrum of the filtered IR radiation $R_o$ having a center wavelength $\lambda_o$ emitted by the IR emitter 120 and filtered by the optical filter structure 130 according to embodiment.

An embodiment of the present concept of a fluid sensor 100 and a method for manufacturing a fluid sensor 100 can be summarized as follows.

The overall system 100 comprises of the thermal radiation emitter 120 with a wavelength-selective filter structure 130 and coupling structure 160 for coupling in a narrow wavelength band Ro into the waveguide 140, e.g. a slot waveguide.

The thermal radiation emitter 120 comprises a heavily doped (e.g., N+ silicon) silicon wire 122 comprising, adjacent to the coupling element 130, 160, a silver or aluminum layer 124 having a thickness of, for example, between 50 Å and 1 μm. Together with the heavily doped silicon wire 122, the silver layer 124 generates a black body radiator in the μm range. The wavelength coupled in to the waveguide 140 (slot waveguide) can be adjusted exactly to the desired wavelength λo for the fluid, e.g. gas or liquid, to be detected in the ambient atmosphere by designing or dimensioning filter structure 130, e.g. the Bragg-mirror or photonic crystal. The heater 120 operates, for example, in the range of 600-1000° K or 600-700° K, in order to obtain a power consumption of the emitter 120 that is as optimally as possible with respect to the resulting sensitivity. Higher temperatures of the heater 120 would require significantly increased power consumption of the heater 120 and would thus be hardly suitable for mobile applications. See also the Planck's radiation spectrum.

For multi-gas sensing, it is also possible to provide several filters/coupling elements 130 at the emitter 120 or at several emitter elements 120 with respectively allocated coupling/filter elements 130/160 and allocated waveguide 140 in order to obtain sensitivity for several fluid, e.g. gases or liquids, to be sensed in the ambient medium, e.g. the ambient atmosphere. Here, the respective waveguide 140 is optimized to the specific wavelength $\lambda_o$ for sensing a specific gas.

The measurement effect uses of the fact that a change of the concentration of the target gas to be sensed in the ambient atmosphere causes a change of the refraction index n and hence a change of the EFR (EFR=evanescent field ratio) that can again be detected at the thermal radiation detector 150 as changed incoming radiation power and can be allocated to the current concentration of the target fluid (gas or liquid) in the ambient atmosphere.

The radiation power during coupling in and in a predetermined atmosphere (reference atmosphere) can be used as a comparison value, for example.

The thickness of the polysilicon material for the waveguide 140 and the heating, filtering and coupling element 120, 130, 160 is, for example, 660 nm±200 nm or in a range between 0.2-1.4 μm.

A pyroelectric detector may be used as the thermal radiation detector 150, which is also structured in the polysilicon plane. A change of the irradiated IR radiation $R_o$ results in a change of temperature of the temperature-sensitive pyroelectric detector 150 from which the transmitted amount of energy and, based on a respective attenuation of the signal, the proportion of the target fluid (gas or liquid) in the ambient atmosphere can be determined.

Thus, the fluid sensor 100 may provide a CMOS MID IR gas and liquid sensor based on a formation of a superimposed evanescent field, with an aluminum poly-heater and a thermoelectric AlScN or AlN detector. The present concept is the formation of an evanescent field and guidance of an IR wave in a waveguide in total reflection. The system operates across two different refractive indices, wherein one of them is fixed by the poly-waveguide and the other one is determined by the gas surrounding the waveguide, $CO/CO_2/O_3/NO_x$/methane, for example.

Additional embodiments and aspects are described which may be used alone or in combination with the features and functionalities described herein.

According to an aspect, a fluid sensor comprises: a substrate having a top main surface region, wherein the top main surface region of the substrate forms a common system plane of the fluid sensor, a thermal radiation emitter on the top main surface region of the substrate, wherein the thermal radiation emitter comprises a semiconductor strip having a main emission surface region for emitting a broadband thermal radiation in a main radiation emission direction parallel to the system plane, an optical filter structure on the top main surface region of the substrate, wherein the optical filter structure comprises a semiconductor material and is configured to filter the broadband thermal radiation emitted by the thermal radiation emitter and to provide a filtered thermal radiation having a center wavelength $\lambda_o$, a waveguide on the main top surface region of the substrate, wherein the waveguide comprises a semiconductor material and is configured to guide the filtered thermal radiation having the center wavelength $\lambda_o$, wherein the guided thermal radiation comprises an evanescent field component for interacting with the surrounding atmosphere comprising a target fluid, and a thermal radiation detector on the top main surface region of the substrate, wherein the thermal radiation detector is configured to provide an detector output signal based on a radiation strength of the filtered thermal radiation received from the waveguide.

According to a further aspect, the fluid sensor further comprises: an incoupling structure on the top main surface region of the substrate, wherein the incoupling structure comprises a semiconductor material and is configured to couple the filtered thermal radiation having the center wavelength $\lambda_o$ at least partially into the waveguide.

According to a further aspect, the incoupling structure is part of the optical filter structure or part of the waveguide.

According to a further aspect, the in-coupling structure has a tapered shape between the optical filter structure and the waveguide and parallel to the system plane.

According to a further aspect, the in-coupling structure is configured to couple a mode of the filtered thermal radiation that propagates in the waveguide with the center wavelengths $\lambda_o$ into the waveguide.

According to a further aspect, the IR emitter comprises a metallic cover layer which at least partially covers the main emission surface region of the semiconductor strip.

According to a further aspect, the semiconductor strip comprises a highly doped polysilicon material to form a black body radiator and is configured to have in an actuated condition an operating temperature in a range between 600 and 1000° K, and the thermal radiation emitter is connected to a power source for providing the electrical energy to bring the thermal radiation emitter in the actuated condition.

According to a further aspect, the optical filter structure is formed as an optical resonator structure having a narrow transmission band with the center wavelength $\lambda_o$, and the optical filter structure comprises a photonic crystal structure or a Bragg filter structure as wavelength selective optical elements for providing the filtered thermal radiation having the center wavelength $\lambda_o$.

According to a further aspect, the optical filter structure comprises in a plurality of laterally spaced semiconductor strips which are arranged parallel to each other and vertical to the system plane and perpendicular to the IR radiation propagation direction.

According to a further aspect, the waveguide comprises a meander shape in the system plane.

According to a further aspect, the waveguide comprises a strip waveguide, a slab waveguide, a slot waveguide or a rib waveguide.

According to a further aspect, the interaction of the evanescent field component with the surrounding atmosphere results in a reduction of the transmitted thermal radiation $R_o$ due to absorption which is a measure for the target fluid concentration in the surrounding atmosphere.

According to a further aspect, the thermal radiation detector comprises a pyroelectric temperature sensor, a piezoelectric temperature sensor, a pn junction temperature sensor or a resistive temperature sensor.

According to a further aspect, the thermal radiation detector is configured to sense the incoming thermal radiation which is a measure of the concentration of the target fluid in the surrounding atmosphere based on the evanescent field absorption effected by the target fluid.

According to a further aspect, the thermal radiation emitter, the optical filter structure, the waveguide, and the thermal radiation detector comprise a polysilicon material.

According to a further aspect, the substrate comprises a cavity vertically below the thermal radiation emitter and/or the thermal radiation detector.

According to an aspect, a method for manufacturing the inventive fluid sensor comprises: providing a substrate having a dielectric layer which forms the top main surface region of the substrate, and depositing the polysilicon material of the thermal radiation emitter, the optical filter structure, the waveguide and the thermal radiation receiver with a CMOS process on the top main surface region of the substrate.

According to a further aspect, the method further comprises: sputtering and structuring a metallic layer for at least partially covering the main emission surface region of the highly doped polysilicon semiconductor strip with the metallic layer.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A fluid sensor, comprising:
a substrate having a top main surface region, wherein the top main surface region of the substrate forms a common system plane of the fluid sensor;
a thermal radiation emitter on the top main surface region of the substrate, wherein the thermal radiation emitter comprises a semiconductor strip having a main emission surface region for emitting a broadband thermal radiation in a main radiation emission direction parallel to the system plane;
an optical filter structure on the top main surface region of the substrate, wherein the optical filter structure comprises a semiconductor material and is configured to filter the broadband thermal radiation emitted by the thermal radiation emitter and to provide a filtered thermal radiation having a center wavelength $\lambda_o$;
a waveguide on the main top surface region of the substrate, wherein the waveguide comprises a semiconductor material and is configured to guide the filtered thermal radiation having the center wavelength $\lambda_o$, wherein the guided thermal radiation comprises an evanescent field component for interacting with a surrounding atmosphere comprising a target fluid; and
a thermal radiation detector on the top main surface region of the substrate, wherein the thermal radiation detector is configured to provide an detector output signal based on a radiation strength of the filtered thermal radiation received from the waveguide.

2. The fluid sensor of claim 1, further comprising:
an in-coupling structure on the top main surface region of the substrate, wherein the in-coupling structure comprises a semiconductor material and is configured to couple the filtered thermal radiation having the center wavelength $\lambda_o$ at least partially into the waveguide.

3. The fluid sensor of claim 2, wherein the in-coupling structure is part of the optical filter structure or part of the waveguide.

4. The fluid sensor of claim 2, wherein the in-coupling structure has a tapered shape between the optical filter structure and the waveguide and parallel to the system plane.

5. The fluid sensor of claim 2, wherein the in-coupling structure is configured to couple a mode of the filtered thermal radiation that propagates in the waveguide with the center wavelengths $\lambda_o$ into the waveguide.

6. The fluid sensor of claim 1, wherein the thermal radiation emitter comprises a metallic cover layer which at least partially covers the main emission surface region of the semiconductor strip.

7. The fluid sensor of claim 6, wherein the semiconductor strip comprises a highly doped polysilicon material to form a black body radiator and is configured to have in an actuated condition an operating temperature in a range between 600 and 1000 K, and wherein the thermal radiation emitter is connected to a power source for providing electrical energy to bring the thermal radiation emitter in the actuated condition.

8. The fluid sensor of claim 1, wherein the optical filter structure is formed as an optical resonator structure having a narrow transmission band with the center wavelength $\lambda_o$, and wherein the optical filter structure comprises a photonic crystal structure or a Bragg filter structure as wavelength selective optical elements for providing the filtered thermal radiation having the center wavelength $\lambda_o$.

9. The fluid sensor of claim 8, wherein the optical filter structure comprises in a plurality of laterally spaced semiconductor strips which are arranged parallel to each other and vertical to the system plane and perpendicular to a thermal radiation propagation direction.

10. The fluid sensor of claim 1, wherein the waveguide comprises a meander shape in the system plane.

11. The fluid sensor of claim 1, wherein the waveguide comprises a strip waveguide, a slab waveguide, a slot waveguide or a rib waveguide.

12. The fluid sensor of claim 1, wherein the interaction of the evanescent field component with the surrounding atmosphere results in a reduction of transmitted thermal radiation due to absorption which is a measure for target fluid concentration in the surrounding atmosphere.

13. The fluid sensor of claim 1, wherein the thermal radiation detector comprises a pyroelectric temperature sensor, a piezoelectric temperature sensor, a pn junction temperature sensor or a resistive temperature sensor.

14. The fluid sensor of claim 1, wherein the thermal radiation detector is configured to sense incoming thermal radiation which is a measure of a concentration of the target fluid in the surrounding atmosphere based on evanescent field absorption effected by the target fluid.

15. The fluid sensor of claim 1, wherein the thermal radiation emitter, the optical filter structure, the waveguide, and the thermal radiation detector comprise a polysilicon material.

16. The fluid sensor of claim 1, wherein the substrate comprises a cavity vertically below the thermal radiation emitter and/or the thermal radiation detector.

17. A method of manufacturing a fluid sensor, the method comprising:
providing a substrate having a top main surface region, wherein the top main surface region of the substrate forms a common system plane of the fluid sensor;
forming a thermal radiation emitter on the top main surface region of the substrate, wherein the thermal radiation emitter comprises a semiconductor strip having a main emission surface region for emitting a broadband thermal radiation in a main radiation emission direction parallel to the system plane;
forming an optical filter structure on the top main surface region of the substrate, wherein the optical filter structure comprises a semiconductor material and is configured to filter the broadband thermal radiation emitted by the thermal radiation emitter and to provide a filtered thermal radiation having a center wavelength $\lambda_o$;
forming a waveguide on the main top surface region of the substrate, wherein the waveguide comprises a semiconductor material and is configured to guide the filtered thermal radiation having the center wavelength $\lambda_o$, wherein the guided thermal radiation comprises an evanescent field component for interacting with a surrounding atmosphere comprising a target fluid; and
forming a thermal radiation detector on the top main surface region of the substrate, wherein the thermal radiation detector is configured to provide an detector output signal based on a radiation strength of the filtered thermal radiation received from the waveguide.

18. The method of claim 17, further comprising:
sputtering and structuring a metallic layer for at least partially covering the main emission surface region of the semiconductor strip with the metallic layer.

* * * * *